United States Patent [19]

Tate

[11] Patent Number: 5,588,847

[45] Date of Patent: Dec. 31, 1996

[54] CHIP CARRIER MOUNTING SYSTEM

[76] Inventor: John O. Tate, P.O. Box 353, Uxbridge, Mass. 01569

[21] Appl. No.: 421,839

[22] Filed: Apr. 13, 1995

[51] Int. Cl.⁶ .................................................... H01R 9/09
[52] U.S. Cl. .......................................... 439/71; 439/331
[58] Field of Search ............................. 439/70, 71, 73, 439/525, 526, 68, 331

[56] References Cited

U.S. PATENT DOCUMENTS

| | | | |
|---|---|---|---|
| 4,035,046 | 7/1977 | Kloth | 439/71 |
| 4,491,378 | 1/1985 | Crawford | 439/71 X |
| 4,690,646 | 9/1987 | Sibata | 439/71 |
| 4,934,944 | 6/1990 | Kozel et al. | 439/68 |
| 5,073,116 | 12/1991 | Beck, Jr. | 439/71 |
| 5,226,824 | 7/1993 | Karlovich et al. | 439/70 |
| 5,236,367 | 8/1993 | McHugh et al. | 439/525 X |
| 5,364,278 | 11/1994 | Laub | 439/73 X |

*Primary Examiner*—Allan N. Shoap
*Assistant Examiner*—Christopher J. McDonald
*Attorney, Agent, or Firm*—Salter & Michaelson

[57] ABSTRACT

A chip carrier mounting system of the present invention includes a chip carrier socket which is mounted (e.g., by soldering) on a printed circuit board. The chip carrier socket has a frame and a plurality of spaced-apart, inwardly projecting contact members constructed of electrically conductive material. The system further includes a chip carrier constructed and arranged for receiving and securing a chip thereto. The chip carrier includes a frame having a plurality of spaced-apart receiving slots in registry with and capable of receiving the contact members therein for securing the chip carrier to the chip carrier socket. Each receiving slot has an electrically conductive surface mount for providing electrical connection between the chip, chip carrier, chip carrier socket and printed circuit board. The system also includes a retaining clip releasably securable to the chip carrier socket for maintaining the chip carrier and chip carrier socket in assembled relation.

4 Claims, 4 Drawing Sheets

CHIP CARRIER MOUNTING SYSTEM

BACKGROUND AND SUMMARY OF THE INVENTION

This invention relates generally to computer chip mounts, and more particularly to a computer chip carrier mounting system especially suited for mounting a computer chip on a printed circuit board.

In the computer chip industry, there are several methods used to mount a computer chip to a printed circuit board. One such method is by mounting the computer chip on a chip carrier and releasably securing the chip carrier to a chip carrier socket which is soldered onto the printed circuit board. Pursuant to the teachings of this method, the socket includes a plurality of contact members which are resiliently engageable with the chip carrier. More particularly, the chip carrier has a plurality of spaced-apart receiving slots aligned with the contact members of the socket for receiving the contact members therein. Each of the contact members resiliently engages the chip carrier for securing the chip carrier to the chip carrier socket and for providing electrical continuity between the chip, chip carrier, socket and printed circuit board.

One disadvantage associated with this method is that the chip carrier has a tendency to "pop-out" of the socket. One solution to this problem has been to provide a retaining clip for securing the chip carrier to the socket. Such retaining clips include long thin strips of resilient metal which extend diagonally across the socket and securely retain the chip carrier within the socket. However, prior art retaining clips also have a tendency to become disassociated from the socket when the printed circuit board is subject to shock and vibration, and also have a tendency to wobble. There is presently a need for a mounting system which securely retains a chip to a printed circuit board.

Accordingly, among the several objects of the present invention are the provision of an improved chip carrier mounting system which securely retains a computer chip to a printed circuit board; the provision of such a mounting system which improves the electrical contact between a chip carrier which receives the computer chip and a chip carrier socket which receives the chip carrier; the provision of such a mounting system which makes it easy to replace a computer chip on a printed circuit board; and the provision of such a mounting system which is easy to install.

In general, a chip carrier mounting system of the present invention comprises a chip carrier socket which is mounted (e.g., by soldering) on a printed circuit board. The chip carrier socket has a rectangular frame with inwardly facing surfaces which define a rectangular opening, and a plurality of spaced-apart, inwardly projecting contact members each being mounted on the frame and resiliently movable along a plane generally perpendicular to the plane of its respective surface. Each contact member is constructed of electrically conductive material and has an outwardly extending foot portion. The system further comprises a chip carrier constructed and arranged for receiving and securing a chip thereto. The chip carrier has outwardly facing surfaces adapted to face the inwardly facing surfaces of the chip carrier socket when placing the chip carrier within the opening of the socket, and a plurality of spaced-apart receiving slots in registry with and capable of receiving the contact members therein for securing the chip carrier to the chip carrier socket. Each receiving slot has an electrically conductive surface mount for providing electrical connection between the chip, chip carrier, chip carrier socket and printed circuit board when the foot portion of each contact member is in resilient engagement with the electrically conductive surface mount of its respective receiving slot.

The system further includes a retaining clip releasably securable to the chip carrier socket. The retaining clip has a wall positioned to overly and engage the chip carrier, a pair of oppositely directed fingers at opposite corners of the wall which releasably engage the chip carrier socket for securing the retaining clip to the chip carrier socket, and a pair of oppositely directed extension members at other opposite corners of the wall which are adapted to be engaged by the chip carrier socket for stabilizing the retaining clip along a horizontal plane. The retaining clip prevents the unwanted removal of the chip carrier from the chip carrier socket thereby ensuring electrical connection between the chip, chip carrier, chip carrier socket and printed circuit board.

Other objects, features and advantages of the invention shall become apparent as the description thereof proceeds when considered in connection with the accompanying illustrative drawings.

BRIEF DESCRIPTION OF THE DRAWINGS

In the drawings which illustrate the best mode presently contemplated for carrying out the present invention.

Corresponding reference numerals designate corresponding parts throughout the several views of the drawings.

DETAILED DESCRIPTION OF THE PREFERRED EMBODIMENTS

Figure 1:
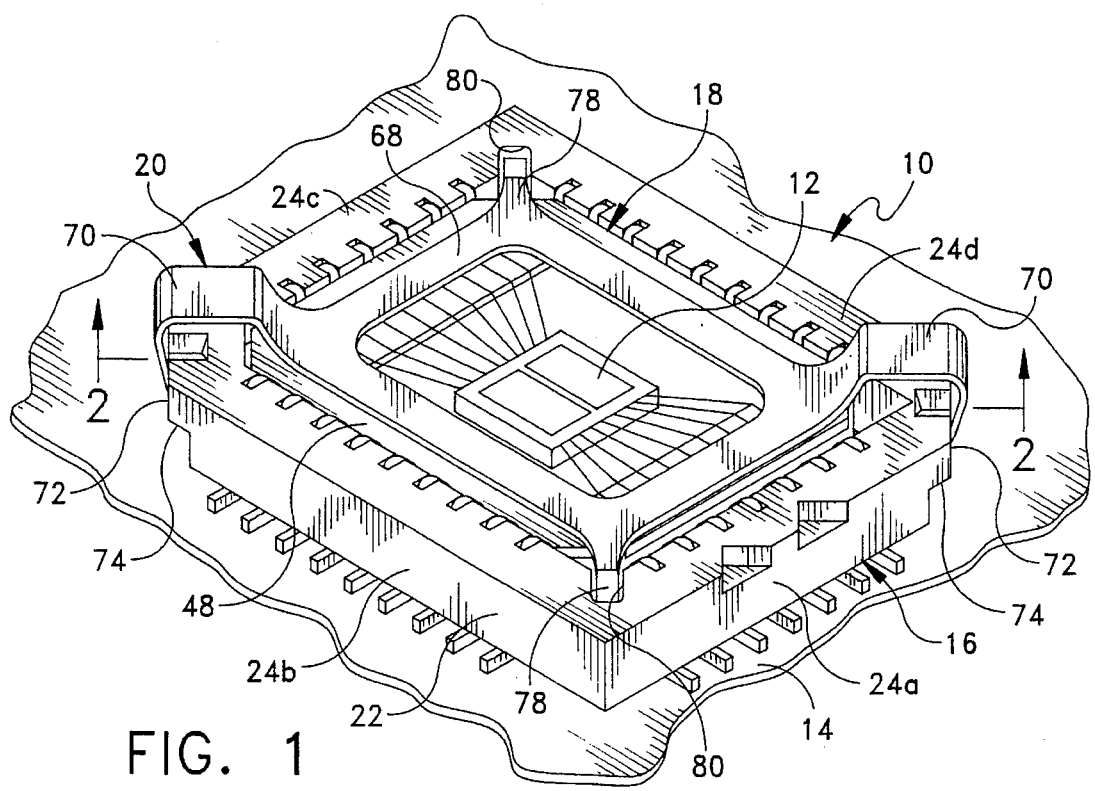
FIG. 1 is a perspective view of a chip carrier mounting system of the present invention.
Figure 2:
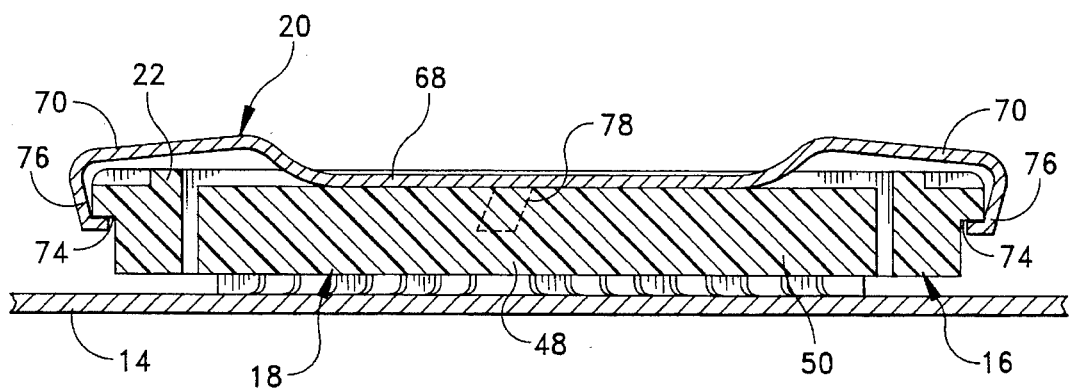
FIG. 2 is a cross-sectional view taken along line 2—2 of FIG. 1.

Referring now to the drawings, there is generally indicated at 10 a chip carrier mounting system of the present invention which is capable of mounting a computer chip 12 on a printed circuit board 14. More specifically, the chip carrier mounting system 10 comprises a chip carrier socket, generally indicated at 16, which is preferably soldered to the printed circuit board 14, a chip carrier, generally indicated at 18, which is designed to receive and secure the computer chip 12 thereto, and a retaining clip, generally indicated at 20, which is releasably secured to the chip carrier socket 16 for maintaining the chip carrier 18 in assembled relation with the socket 16.

Figure 3:
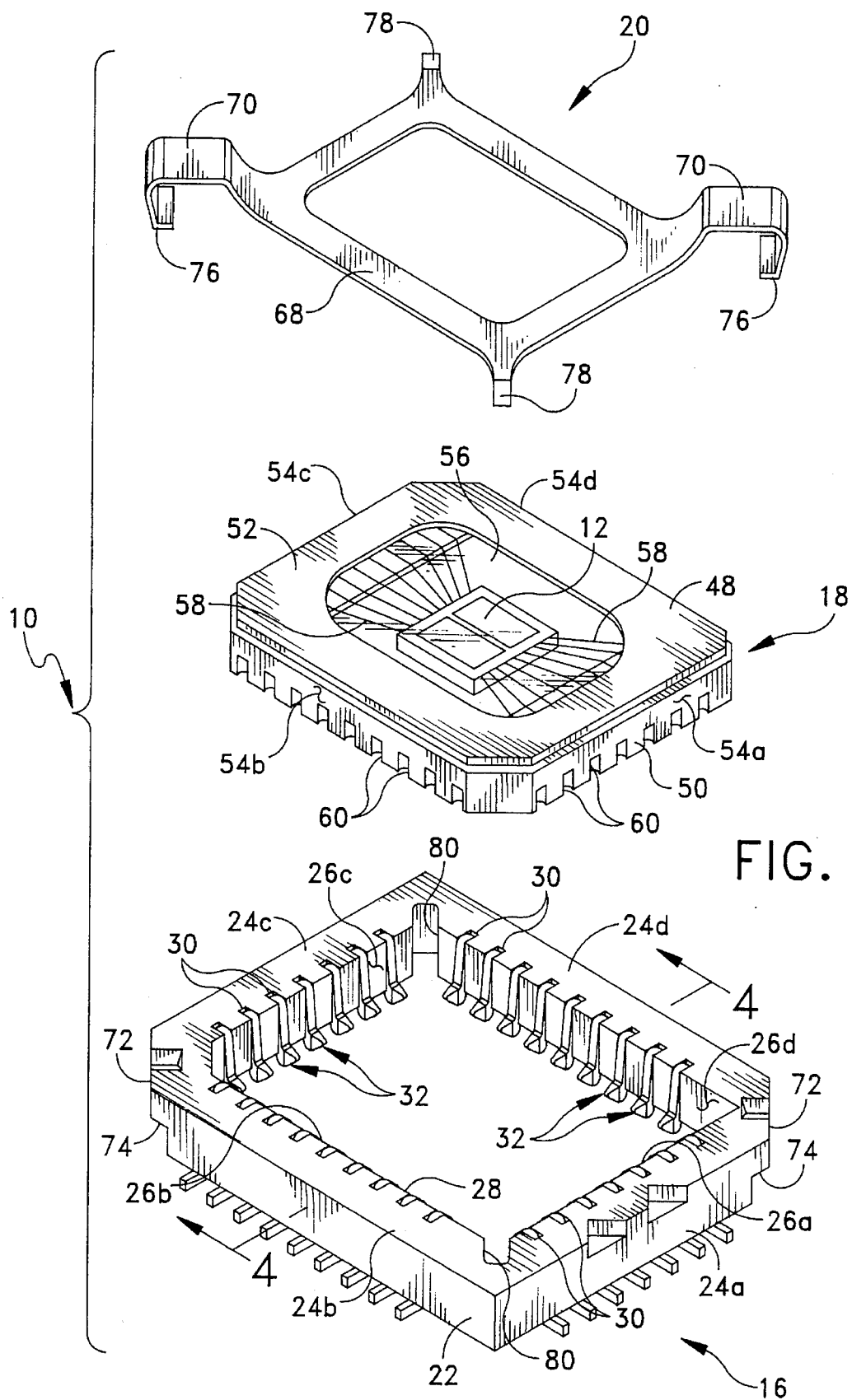
FIG. 3 is an exploded perspective view of the mounting system.

Referring to FIG. 3, the chip carrier socket 16 comprises a rectangular (or square) frame 22 fabricated from insulating (nonconductive) material, such as plastic or ceramic material. The frame 22 has four rail members 24a, 24b, 24c and 24d having respective inwardly facing surfaces 26a, 26b, 26c and 26d which together define a rectangular (or square) opening 28. A plurality of vertically disposed, relatively thin notches 30 are formed in the inwardly facing surfaces 26a–26d of the frame 22. Each notch 30 receives an inwardly projecting contact member generally indicated at 32 suitably mounted on the frame 22 and resiliently moveable along a plane generally perpendicular to the plane of its respective surface 26a–26d. As illustrated throughout the drawings, there are provided a plurality (e.g., nine) contact members 32 on the long rail members 24b, 24d of the frame 22 and a plurality (e.g., seven) contact members 32 on the short rail members 24a, 24c of the frame 22. It should be understood that any number of contact members 32 may be provided and fall within the scope of the present invention. Each contact member 32 is constructed of electrically conductive material, such as beryllium copper or any conductive material which is gold plated, non-plated, or with any type of plating.

Figure 4:
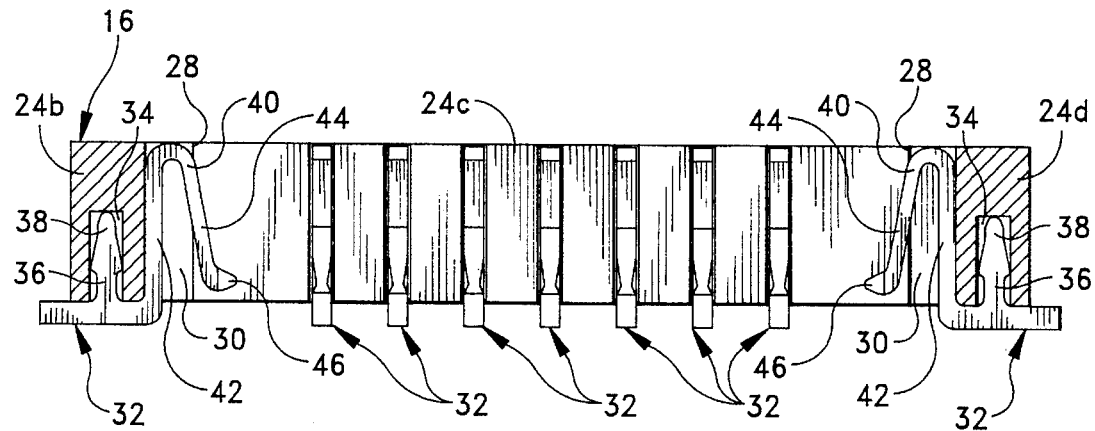
FIG. 4 is a cross-sectional view taken along line 4—4 of FIG. 3.
Figure 5:
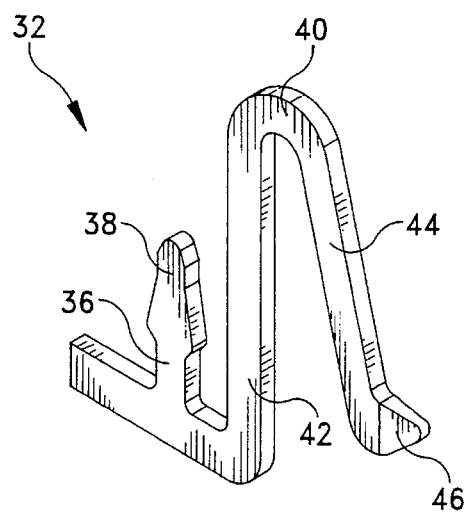
FIG. 5 is an enlarged perspective view of a contact member of the mounting system.
Figure 7:
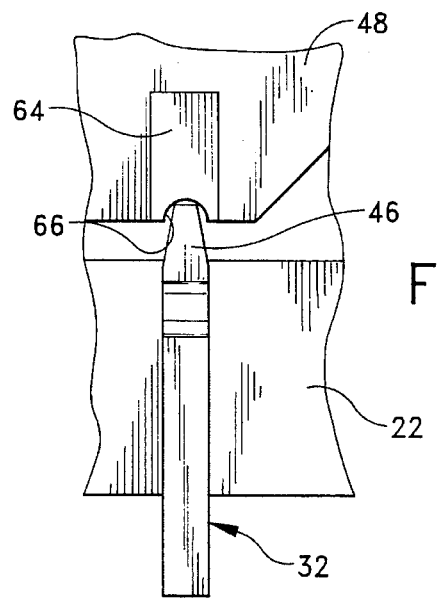
FIG. 7 is an enlarged detail of one contact member engaging a surface mount.

FIGS. 4 and 5 illustrate the attachment of the contact members 32 to the frame 22 of the chip carrier socket 16 and the construction of each contact member 32. As illustrated in FIG. 4, there are vertically oriented bores 34 formed in the underside of the frame 22 which receive upwardly extending extensions 36 of the contact members 32 for attaching the contact members 32 to the frame 22. More specifically, for each contact member 32, the extension 36 is formed with a tapered head 38 which has an interference fit with the frame 22 when inserting the head 38 of the extension into the bore 34. Referring to FIG. 5, each contact member 32 also includes an inverted U-shaped portion 40 wherein an inner leg 42 of the portion 40 is disposed within the notch 30 of the frame 22 for providing lateral stability to the contact member 32 and an outer leg 44 of the portion which extends inwardly within the opening 28 of the frame 22. The outer leg 44 is resiliently attached to the inner leg 42 so that it can move along the aforementioned plane in a generally perpendicular direction with respect to the plane of its respective surface 26a–26d. Each outer leg 44 has a tapered foot portion 46 which is illustrated in FIG. 5, the foot portion 46 being provided for ensuring that electrical connection is made between the contact member 32 and the chip carrier 18. More specifically, as illustrated in FIG. 7, the foot portion 46 is formed to taper from the base of the leg 44 in a widthwise dimension to a narrowed, rounded end. The importance of this particular construction will become apparent as the description of the mounting system 10 continues.

Turning back to FIGS. 1 and 3, the chip carrier 18 comprises a rectangular (or square) frame 48 having a rectangular base portion 50 and a top wall 52 which overlies the base portion 50. Like the frame 22 of the chip carrier socket 16, the chip carrier's frame 48 is fabricated from insulating (nonconductive) material, such as plastic or ceramic material. The base portion 50 has four outwardly facing surfaces 54a, 54b, 54c and 54d which are adapted to face the inwardly facing surfaces 26a–26d of the chip carrier socket 16 when placing the chip carrier 18 within the opening 28 of the socket 16. The base portion 50 further includes an interior region 56 formed therein for receiving the computer chip. As shown, a plurality of leads 58 are attached to the computer chip 12 for providing electrical communication therefrom. The interior region 56 of the base portion 50 of the chip carrier is filled with suitable polymeric material which hardens for securably mounting the chip therein.

As best illustrated in FIG. 3, the base portion 50 of the chip carrier 18 has a plurality of spaced-apart receiving slots 60 in registry with and capable of receiving the contact members 32 therein when the chip carrier 18 is placed within the opening 28 of the socket 16. The leads 58 attached to the computer chip 12 are connected to electrically conductive surface mounts 64 housed within the slots 60 so that when the chip carrier 18 is placed in the chip carrier socket 16, the surface mounts 64 engage the tapered foot portions 46 of the contact members 32 of the socket 16 for releasably securing the chip carrier 18 to the socket 16 and for providing electrical continuity between the chip 12 and printed circuit board 14. When all of the tapered foot portions 46 of the contact members 32 are in engagement with their respective surface mounts 64, the chip carrier 18 is secured in place with respect to the socket 16 and can only be removed therefrom by applying a substantial axial force on the chip carrier 18. The reason for the relatively strong securement of the chip carrier 18 to the socket 16 is because each foot portion 46 is in resilient engagement with its respective surface mount 64. As with the contact members 32, the surface mounts 64 are preferably fabricated from metal (e.g., beryllium copper) and are plated (e.g., with gold).

Figure 6:
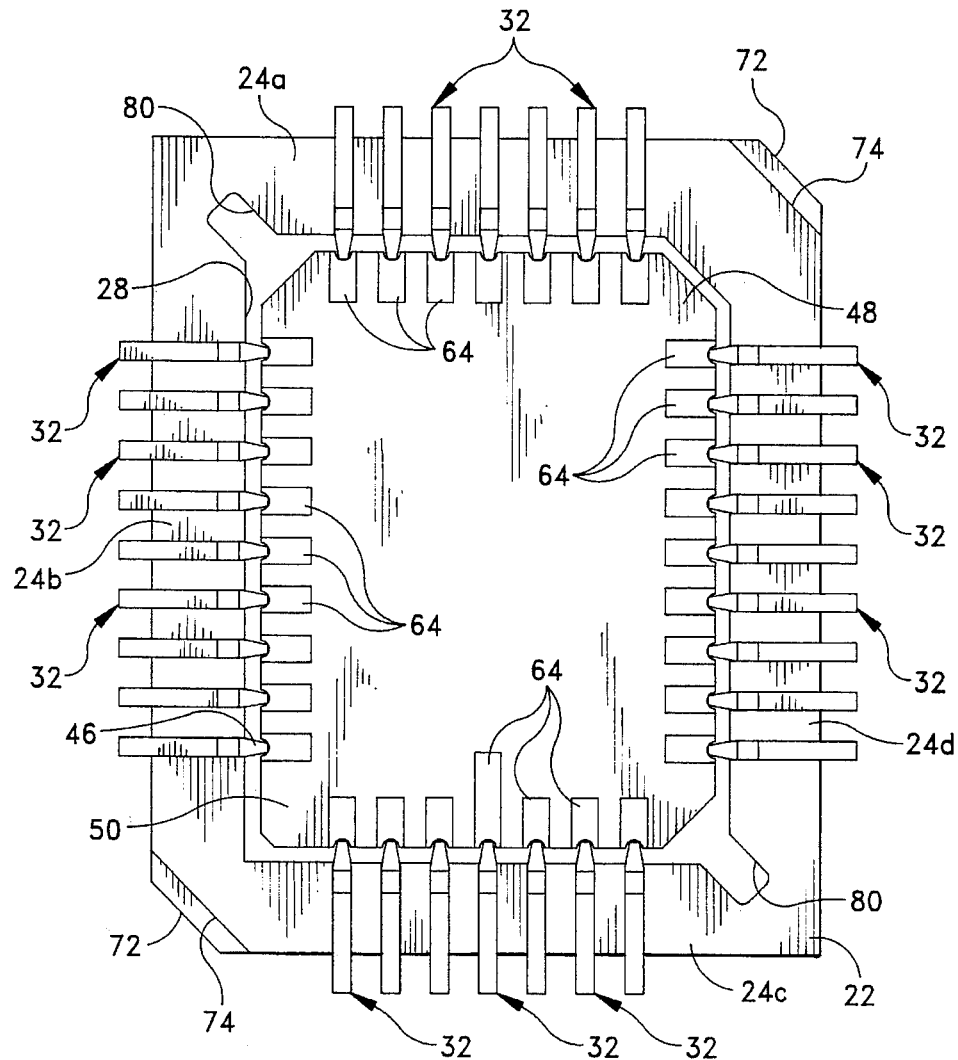
FIG. 6 is a bottom plan view of the mounting system.

Referring now to FIGS. 6 and 7, the surface mounts of the chip carrier have concave surfaces 66 especially suited for engaging the tapered foot portions 46 of the contact members 32. The concave-shaped surfaces 66 of each surface mount 64 assist in securing the chip carrier 18 to the chip carrier socket 16 thereby reducing the likelihood of the chip carrier 18 from "popping-out" of the socket 16. The resilient nature of the outer leg 44 of each contact member 32 provides a suitable engaging force for securing the chip carrier 18 to the socket 16. An additional benefit of having tapered foot portions 46 is that they will engage mounts having varying surface radii or surface mounts having a relatively planar surface.

For substantially ensuring that the chip carrier 18 does not "pop-out" of the chip carrier socket 16, the retaining clip 20 is releasably securable to the socket 16 in a position where it overlies the chip carrier 18. As shown, the retaining clip 20 comprises a planar, annular wall 68 which is positioned to overly and engage the chip carrier 18, and a pair of oppositely directed fingers 70 located at opposite corners of the wall 68. Preferably, the retaining clip 20 is fabricated from stainless steel. Since the clip 20 is relatively thin (i.e., 0.012 inch), it is resilient and may be deformed for attaching it to the chip carrier socket 16. The chip carrier socket 16, at each location where the fingers 70 engage the socket 16, has a chamfered corner 72 and a shoulder portion 74 formed therein for receiving and releasably securing the fingers 70 of the retaining clip 20 thereto. As illustrated in FIG. 3, each finger 70 of the retaining clip 20 has an inwardly bent outer end 76 for clamping the chamfered corner 72 of the socket 16 whereby the outer end 76 of the finger 70 is in clamping engagement with the shoulder portion 74 of the corner. Since the bent outer end 76 of each finger 70 is resilient in that it is capable of being extended outwardly and spread apart for slipping the finger 70 over the socket 16 when securing the retaining clip 20 thereto.

The retaining clip 20 also includes a pair of oppositely directed extension members 78 located at the other opposite corners of the wall 68 of the clip 20. These extension members 78 slope downwardly in such a fashion that they are received in inwardly opening slots 80 formed in the socket at opposite corners of the socket 16. The extension members 78 assist in stabilizing the clip 20 so that the wall 68 of the clip 20 maintains its engaging relationship with the chip carrier 18. It should be noted that the extension members 78 substantially prevent the clip 20 from wobbling when attached to the chip carrier socket 16.

In assembly, the chip carrier 18 is inserted into the opening 28 of the chip carrier socket 16 in such a manner that the contact members 32 resiliently engage the electrically conductive surface mounts 64 for securing the chip carrier 18 to the socket 16. Thus, electrical continuity is established between the computer chip 12 and the printed circuit board 14. Next the retaining clip 20 is securably attached to the chip carrier socket 16 by spreading the resilient fingers 70 apart and slipping them over the chamfered corners 72 of the chip carrier socket 16 in such a fashion that the bent outer ends 76 of the fingers 70 clamp the shoulder portions 74 of the socket 16. In this position, the extension members 78 are received in the slots 80 located at the other opposite corners of the socket 16 for further stabilizing the retaining clip 20.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A chip carrier mounting system capable of mounting a computer chip on a printed circuit board, said mounting system comprising:

a chip carrier socket adapted for mounting on a printed circuit board, said chip carrier socket having a rectangular frame with inwardly facing surfaces which define a rectangular opening, and a plurality of spaced-apart, inwardly projecting contact members each being mounted on the frame and resiliently movable along a plane generally perpendicular to the plane of its respective surface, each contact member being constructed of electrically conductive material and having a leg with a base and an inwardly extending, tapered foot portion; and a chip carrier constructed and arranged for receiving and securing a chip thereto, said chip carrier having outwardly facing surfaces adapted to face the inwardly facing surfaces of the chip carrier socket when placing the chip carrier within the opening of the socket, and a plurality of spaced-apart receiving slots in registry with and capable of receiving said contact members therein for securing the chip carrier to the chip carrier socket, each receiving slot having an electrically conductive surface mount for providing electrical connection between the chip, chip carrier, chip carrier socket and printed circuit board when said foot portion of each contact member is in resilient engagement with the electrically conductive surface mount of its respective receiving slot, wherein said foot portion of each contact member is formed to taper from the base of the leg in a widthwise dimension to a narrowed, rounded end for enhancing the electrical connection between said contact member and surface mount and for maintaining said chip carrier and said chip carrier socket in assembled relation.

2. The chip carrier mounting system as set forth in claim 1, said electrically conductive surface mount of each receiving slot being concave.

3. In a chip carrier mounting system capable of mounting a computer chip on a printed circuit board, said mounting system comprising a chip carrier constructed and arranged for receiving and securing a chip thereto, said chip carrier having outwardly facing surfaces and a plurality of spaced-apart receiving slots formed in said outwardly facing surfaces, each receiving slot having an electrically conductive surface mount, wherein the improvement comprises a chip carrier socket adapted for mounting on a printed circuit board, said chip carrier socket comprising a rectangular frame with inwardly facing surfaces which define a rectangular opening, and a plurality of spaced-apart, inwardly projecting contact members each being mounted on the frame and resiliently movable along a plane generally perpendicular to the plane of its respective surface, each contact member being constructed of electrically conductive material and having a leg with a base and an inwardly extending, tapered foot portion, the arrangement being such that when mounting said chip carrier within said opening in the frame of the chip carrier socket, said outwardly facing surfaces of the chip carrier face the inwardly facing surfaces of the chip carrier socket, said contact members being in registry with and capable of being received within said receiving slots of the chip carrier for securing the chip carrier to the chip carrier socket and for providing electrical connection between the chip, chip carrier, chip carrier socket and printed circuit board, said foot portion of each contact member being in resilient engagement with the electrically conductive surface mount of its respective receiving slot, wherein said foot portion of each contact member is formed to taper from the base of the leg in a widthwise dimension to a narrowed, rounded end for enhancing the electrical connection between said contact member and surface mount and for maintaining said chip carrier and said chip carrier socket in assembled relation.

4. The chip carrier mounting system as set forth in claim 3, said electrically conductive surface mount of each receiving slot being concave.

\* \* \* \* \*